(12) United States Patent
Woodall et al.

(10) Patent No.: US 6,448,582 B1
(45) Date of Patent: Sep. 10, 2002

(54) HIGH MODULATION FREQUENCY LIGHT EMITTING DEVICE EXHIBITING SPATIAL RELOCATION OF MINORITY CARRIERS TO A NON-RADIATIVE RECOMBINATION REGION

(75) Inventors: Jerry M. Woodall, Woodbridge; Robert D. Koudelka, New Haven, both of CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 09/666,231

(22) Filed: Sep. 21, 2000

(51) Int. Cl.[7] .................. H01L 27/15; H01L 31/12; H01L 33/00
(52) U.S. Cl. .................. 257/79; 257/14; 257/87
(58) Field of Search .................. 257/79, 87, 103, 257/22, 14, 18, 97, 424, 449, 471, 184, 186

(56) References Cited

U.S. PATENT DOCUMENTS

| | | | |
|---|---|---|---|
| 4,184,170 A | | 1/1980 | Burnham et al. ............ 357/17 |
| 4,354,140 A | | 10/1982 | Nishizawa ................. 313/499 |
| 4,760,430 A | | 7/1988 | Coon et al. ................. 357/17 |
| 5,079,601 A | * | 1/1992 | Esaki et al. .................. 357/4 |
| 5,588,015 A | * | 12/1996 | Yang ........................... 257/22 |
| 5,607,876 A | * | 3/1997 | Biegelsen et al. ........... 257/97 |
| 5,799,026 A | * | 8/1998 | Meyer et al. ................. 257/22 |

OTHER PUBLICATIONS

International Search Report based on PCT Application No. PCT/US01/28071.

* cited by examiner

Primary Examiner—Hoai Ho
Assistant Examiner—Andy Huynh
(74) Attorney, Agent, or Firm—Ohlandt, Greeley, Ruggiero & Perle, L.L.P.

(57) ABSTRACT

A light emitting device is constructed so as to provide a first part that includes a source of excess minority carriers including excess electron-hole pairs; a second part, coupled to the first part, that includes a minority carrier barrier; and a third part, coupled to the second part, that includes a region that exhibits a low radiative recombination efficiency and a short minority carrier lifetime. In response to a first stimulus minority carriers are constrained by the second part to remain in the first part, leading to an increase of minority carrier radiative recombination in the first part and an increase in light emission; while in response to a second stimulus the minority carriers are enabled to cross the minority carrier barrier of the second part to enter the third part, leading to a decrease of minority carrier radiative recombination in the first part and a decrease in light emission. In certain embodiments the first stimulus includes an absence of an electrical signal applied between the second part and the third part, and the second stimulus comprises a presence of the electrical signal applied between the second part and the third part. In other embodiments the first stimulus includes a change in an electric field in the second part that is generated by optically induced electron-hole pairs in the second part, and the second stimulus includes an absence of the change in the electric field. In another embodiment the reverse is true. In certain embodiments the first or second stimulus can be the presence of modulating light incident on the second part and a resultant decrease in band bending. The first part can include, by example, a light emitting diode, a laser diode, a resonant cavity LED, or a vertical cavity surface emitting laser device. In another, all optical embodiment the first part includes a material that, in response to optical pumping, provides a photoluminescent emission. The second part can include a resonant tunneling structure or a potential barrier structure formed by compositional grading or impurity concentration grading. The third part can include a low temperature grown material and/or a Schottky barrier contact. It is shown that embodiments of this invention are capable of exhibiting optical gain, and an optical semiconductor light emitting device with optical gain (SLEDOG) is thus made possible.

20 Claims, 4 Drawing Sheets

ELECTRICALLY MODULATED RESONANT TUNNELING BARRIER-
LIGHT ON LED FORWARD BIASED, BARRIER UNBIASED

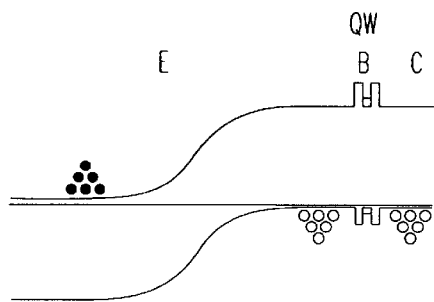

ELECTRICALLY MODULATED RESONANT TUNNELING BARRIER
UNBIASED

FIG. 1a

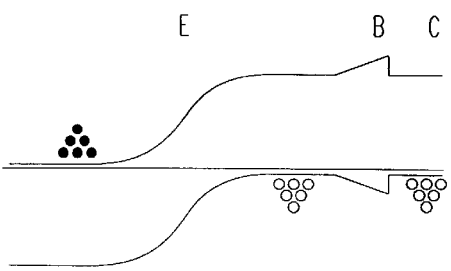

ELECTRICALLY MODULATED RESONANT TUNNELING BARRIER
UNBIASED

FIG. 2a

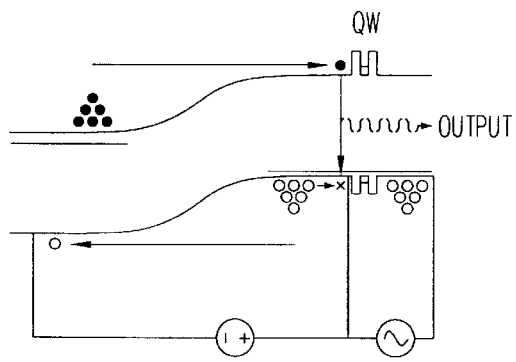

ELECTRICALLY MODULATED RESONANT TUNNELING BARRIER—
LIGHT ON LED FORWARD BIASED, BARRIER UNBIASED

FIG. 1b

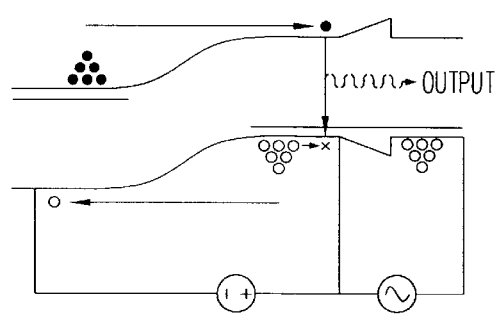

ELECTRICALLY MODULATED TRIANGULAR BARRIER—
LIGHT ON LED FORWARD BIASED, BARRIER UNBIASED

FIG. 2b

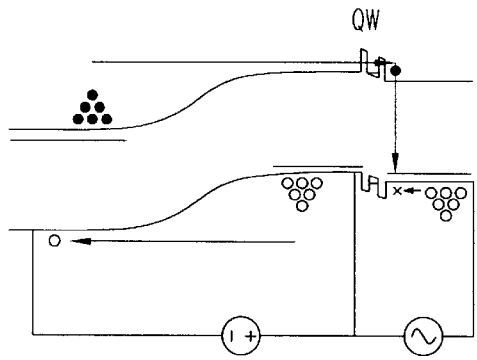

ELECTRICALLY MODULATED RESONANT TUNNELING BARRIER—
LIGHT OFF LED FORWARD BIASED, BARRIER BIASED

FIG. 1c

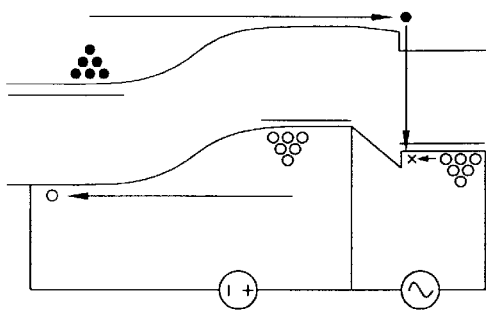

ELECTRICALLY MODULATED TRIANGULAR BARRIER—
LIGHT OFF LED FORWARD BIASED, BARRIER BIASED

FIG. 2c

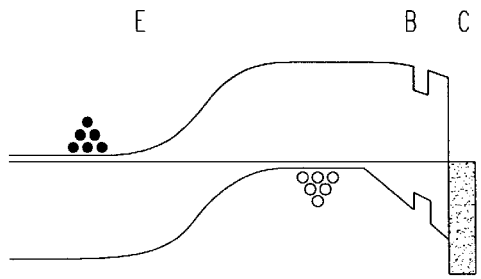

OPTICALLY MODULATED TRIANGULAR BARRIER (NON-INVERTING)
LED UNBIASED, NO INCIDENT LIGHT

FIG. 3a

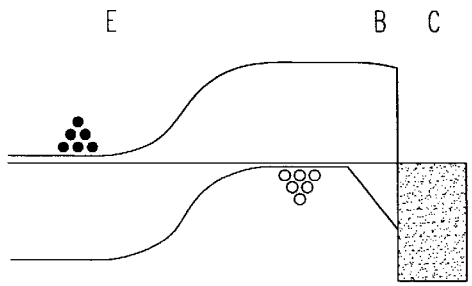

OPTICALLY MODULATED TRIANGULAR BARRIER (NON-INVERTING)
LED UNBIASED, NO INCIDENT LIGHT

FIG. 4a

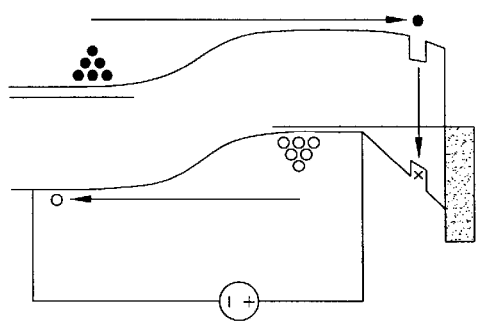

OPTICALLY MODULATED TRIANGULAR BARRIER (LIGHT OFF)
LED FORWARD BIASED, NO INCIDENT LIGHT

FIG. 3b

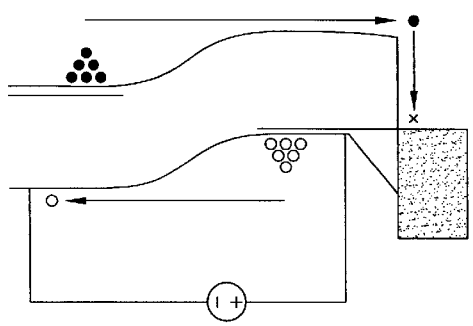

OPTICALLY MODULATED TRIANGULAR BARRIER (LIGHT OFF)
LED FORWARD BIASED, NO INCIDENT LIGHT

FIG. 4b

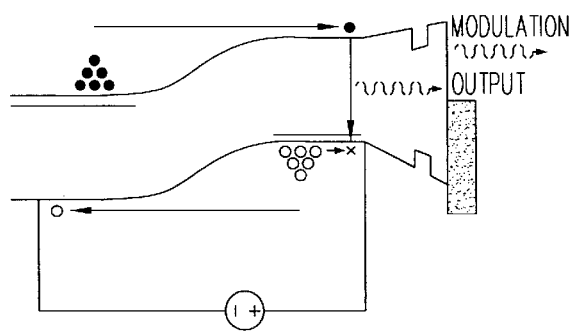

OPTICALLY MODULATED TRIANGULAR BARRIER (LIGHT ON)
LED FORWARD BIASED, INCIDENT LIGHT

FIG. 3c

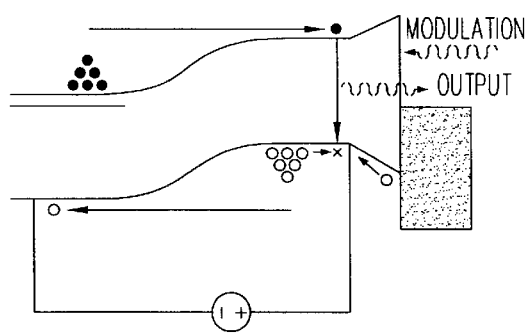

OPTICALLY MODULATED TRIANGULAR BARRIER (LIGHT ON)
LED FORWARD BIASED, INCIDENT LIGHT

FIG. 4c

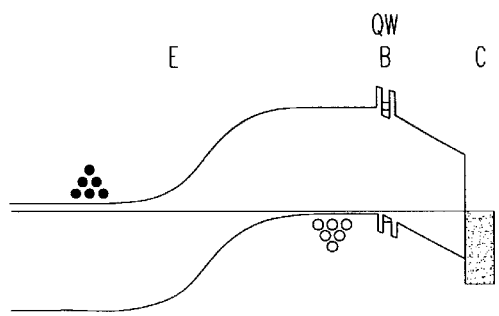

OPTICALLY MODULATED RT BARRIER (INVERTING)
LED UNBIASED, NO INCIDENT LIGHT

FIG. 5a

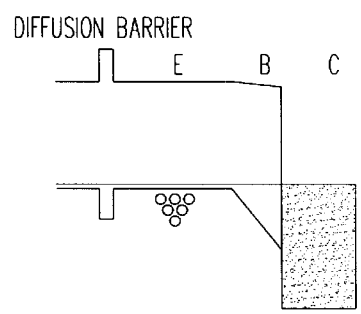

OPTICALLY MODULATED TRIANGULAR BARRIER (NON-INVERTING)
NO INCIDENT LIGHT

FIG. 6a

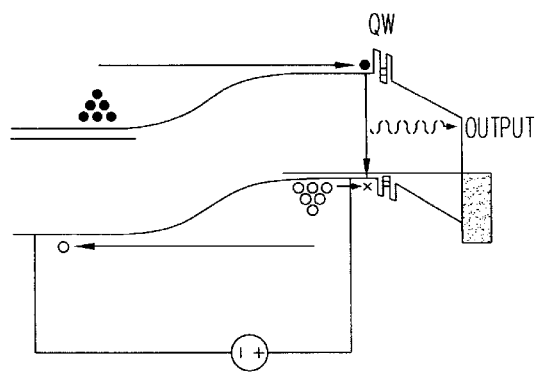

OPTICALLY MODULATED RT BARRIER (INVERTING)
LED FORWARD BIASED, NO INCIDENT LIGHT

FIG. 5b

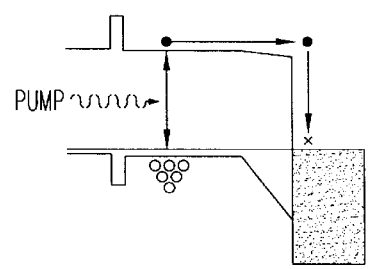

OPTICALLY MODULATED TRIANGULAR BARRIER (LIGHT OFF)
OPTICALLY PUMPED E PART, NO MODULATING LIGHT

FIG. 6b

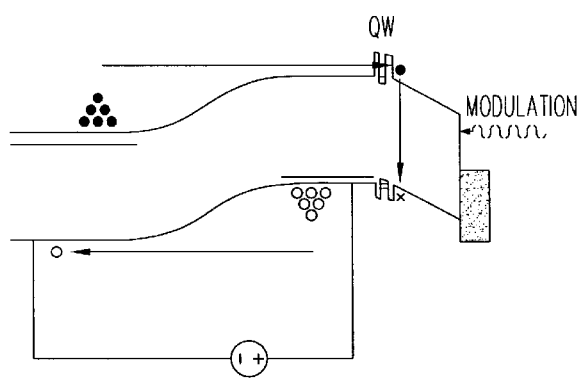

OPTICALLY MODULATED RT BARRIER (INVERTING)
LED FORWARD BIASED, INCIDENT LIGHT

FIG. 5c

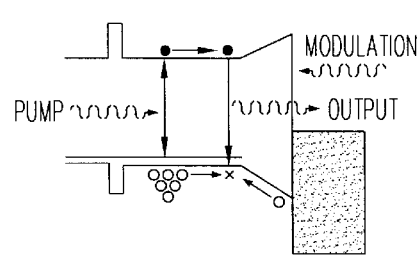

OPTICALLY MODULATED TRIANGULAR BARRIER (LIGHT ON)
OPTICALLY PUMPED E PART, MODULATING LIGHT

FIG. 6c

ULTRA FAST LIGHT EMITTING DEVICE

HIGH MODULATION FREQUENCY LIGHT EMITTING DEVICE EXHIBITING SPATIAL RELOCATION OF MINORITY CARRIERS TO A NON-RADIATIVE RECOMBINATION REGION

FIELD OF THE INVENTION

This invention relates generally to solid state light emitters and, more particularly, relates to semiconductor light emitter devices including, but not limited to, light emitting diodes (LEDs), laser diodes, vertical cavity surface emitting laser devices (VCSELDs), resonant cavity (RC) LEDs and similar devices.

BACKGROUND OF THE INVENTION

Modern data communication systems and networks are increasingly being implemented with optical technology, more specifically with optoelectronic technology. One important element of any optically-based, high bandwidth communication system is the light emitting device. In order to achieve high modulation frequencies of the emitted light it is important that minority carrier recombination occur in an efficient and rapid manner. Put another way, it is desirable to achieve a high modulation frequency of the output light with high radiative efficiency. Prior art light emitting devices have been limited in fulfilling this need.

Current limitations of LEDs include the limited modulation frequency (<1 GHz), limited output power (<1 mW), low optical fiber coupling efficiency (<20%), and broad spectral line width. These properties limit the use of LEDs to applications such as short haul <650 Mbs optical links, as well as to indicator lamps and similar illumination applications.

Current limitations of laser diode devices include low manufacturing yield and hence high cost, non-ideal modulation characteristics (chirping), and a general lack of enablers to manufacture surface emitting lasers that emit in the 1.3 to 1.5 micron wavelength range. These properties limit the current large scale application of laser diodes to discrete cw laser/electro-optically modulated optical links operating at 10 Gb/sec using wavelength division multiplexing (WDM), such as four channels each operating at 2.5 Gb/sec. Thus, since lasers are bandwidth-limited, high bit rate communications rely on parallelism. However, the use of parallelism increases both the cost and complexity of the communication system.

Researchers have recently increased the bandwidth of LEDs, using specialized processing techniques, to 1.7 GHz, and data rates as high as 1.7 Gb/sec have been demonstrated (with a bit error rate <$10^{-9}$ using −23 dBm input power). However, the external optical efficiency was limited to 2.5 $\mu$Watts/mA. Also, in general, optical efficiency decreases with higher speed LED design and fabrication techniques.

A consistent problem that has faced researchers is related to the conflicting goals of attempting to provide device material that exhibits high radiative recombination efficiency, in order to maximize the signal to noise ratio and output power, while at the same time attempting to provide the same device material (with high radiative recombination efficiency) and a short minority carrier lifetime, in order to maximize the frequency at which the generated light can be modulated with the desired information. As can be appreciated, and has been observed in the literature, a point is reached at which one of the radiative efficiency or the modulation frequency will begin to decline at the expense of the other.

It is expected that in the near future system designers will require emitters that can be modulated in excess of 10 GHz, that exhibit high output power at 10 GHz (about 1 mW), and that exhibit a narrow spectral line width and low dispersion losses.

Thus, there is a well recognized need to develop faster and higher power optical emitters.

OBJECTS AND ADVANTAGES OF THE INVENTION

It is a first object and advantage of this invention to provide an improved light emitter that fulfils the foregoing need.

It is a second object and advantage of this invention to provide a light emitting device that includes a light emitting region, such as a LED, laser diode, or VCSELD; a minority carrier barrier, such as a resonant tunneling structure or other potential barrier (such as a triangular, square or parabolic potential barrier structure formed by compositional grading or impurity concentration grading); and a region that exhibits a low radiative recombination efficiency as well as a short minority carrier lifetime, such as a region comprised of a low temperature grown material or a Schottky barrier.

It is a further object and advantage of this invention to provide a light emitting structure wherein light emitting efficiency considerations may be decoupled from modulation frequency considerations, wherein one region of the structure may be optimized to increase minority carrier radiative recombination efficiency and lifetime, while another region of the structure may be optimized to decrease non-radiative minority carrier lifetime.

SUMMARY OF THE INVENTION

The foregoing and other problems are overcome and the foregoing objects and advantages are realized by methods and apparatus in accordance with embodiments of this invention.

This invention fulfils the foregoing and other needs by providing a light emitter, such as a LED, that exhibits (a) a bandwidth in excess of 10 GHz without degraded output power; (b) that operates by surface emission, thereby enabling fabrication in an array format; (c) that provides an ability to be modulated either electrically or optically (with optical gains greater than one); and (d) that has an ability to be fabricated in an all-optical embodiment, wherein the device operates entirely by optical input without requiring electrical connections.

A light emitting device is constructed so as to provide a first part that includes a source of excess minority carriers (over and above equilibrium) and/or excess electron-hole pairs; a second part, coupled to the first part, that includes a minority carrier barrier; and a third part, coupled to the second part, that includes a region that exhibits a low radiative recombination efficiency and short minority carrier lifetimes. In response to a first stimulus minority carriers are constrained by the second part to remain in the first part, leading to an increase of minority carrier radiative recombination in the first part and an increase in light emission; while in response to a second stimulus the minority carriers are enabled to cross the minority carrier barrier of the second part to enter the third part, leading to a decrease of minority carrier radiative recombination in the first part and a decrease in light emission. In certain embodiments the first stimulus includes an absence of an electrical signal applied between the second part and the third part, and the second stimulus comprises a presence of the electrical signal applied between the second part and the third part. In other embodiments the first stimulus induces a change in the electric field in the second part that is generated by optically induced electron-hole pairs in the second part, and the second stimulus includes the electric field that was present prior to the first stimulus. In another embodiment the first stimulus includes an absence of a change in the electric field in the second part, and the second stimulus includes a presence of the change in the electric field generated by the optically induced electron-hole pairs in the second part. In certain embodiments the first stimulus (or the second stimulus) can be the presence of modulating light incident on the second part and a resultant decrease in band bending.

The first part can include, by example, a light emitting diode, a laser diode, a vertical cavity surface emitting laser device, or a resonant cavity light emitting device. In another, all optical embodiment the first part includes a material that, as a result of optical pumping, provides a photoluminescent emission or a laser-type or laser-like emission. The second part can include a resonant tunneling structure, such as quantum well, or one of a triangular, square or parabolic potential barrier structure formed by compositional grading or impurity concentration grading. The third part can include a normal temperature grown or a low temperature (LT) grown material, such as a doped LT GaAs layer, and/or an undoped layer with a Schottky barrier contact.

The light emission can be produced as a result of an electrical bias applied to the light emitting device, or as a result of the above-mentioned optical pumping that results in the photoluminescent emission or the laser-type or laser-like emission.

It is shown that embodiments of this invention are capable of exhibiting optical gain (e.g., gain in excess of 1), and an optical semiconductor light emitting device with optical gain (SLEDOG) is thus made possible by these teachings, as is an all-optical device that does not require electrical inputs.

A method is also disclosed for fabricating a light emitting device. The method includes steps of (a) providing a semiconductor light emitting structure that contains a source of excess minority carriers; (b) forming a first structure over a surface of the semiconductor light emitting structure, where the first structure is formed from a material that functions as a minority carrier barrier upon an application of a predetermined stimulus, thereby constraining minority carriers to remain in the semiconductor light emitting structure and resulting in minority carrier radiative recombination therein; and (c) forming a second structure over the first structure, the second structure containing a material that exhibits a low radiative recombination efficiency and a short minority carrier lifetime. The second structure removes minority carriers that cross the first structure, after escaping from the semiconductor light emitting structure, in the absence of the predetermined stimulus.

BRIEF DESCRIPTION OF THE DRAWINGS

The above set forth and other features of the invention are made more apparent in the ensuing Detailed Description of the Invention when read in conjunction with the attached Drawings, wherein:

FIGS. 1–6 are bandgap diagrams that are illustrative of embodiments of the teachings herein, where:

FIG. 1 illustrates an electrically modulated resonant tunneling barrier embodiment, wherein FIG. 1A shows a tunneling barrier unbiased state, FIG. 1B shows a light on, LED forward biased, barrier unbiased state, and FIG. 1C shows a light off, LED forward biased, barrier biased state;

FIG. 2 illustrates an electrically modulated triangular barrier embodiment, wherein FIG. 2A shows a triangular barrier unbiased state, FIG. 2B shows a light on, LED forward biased, barrier unbiased state, and FIG. 2C shows a light off, LED forward biased, barrier biased state;

FIG. 3 illustrates an optically modulated triangular barrier (non-inverting) with LT GaAs region embodiment, wherein FIG. 3A shows a LED unbiased, no incident light state, FIG. 3B shows a light off, LED forward biased, no incident light state, and FIG. 3C shows a light on, LED forward biased, incident light present state;

FIG. 4 illustrates an optically modulated triangular barrier (non-inverting) embodiment, wherein FIG. 4A shows a LED unbiased, no incident light state, FIG. 4B shows a light off, LED forward biased, no incident light state, and FIG. 4C shows a light on, LED forward biased, incident light present state;

FIG. 5 illustrates an optically modulated resonant tunneling (RT) barrier (inverting) with LT GaAs region embodiment, wherein FIG. 5A shows a LED unbiased, no incident light state, FIG. 5B shows a LED forward biased, light on, no incident light state, and FIG. 5C shows a LED forward biased, light off, incident light present state;

FIG. 6 illustrates an optically modulated triangular barrier (non-inverting) embodiment, wherein FIG. 6A shows a no incident or pump light state, FIG. 6B shows a light off, optically pumped E-part, no modulating light state, and FIG. 6C shows a light on, optically pumped E-part, modulating light present state.

DETAILED DESCRIPTION OF THE INVENTION

Figure 7:
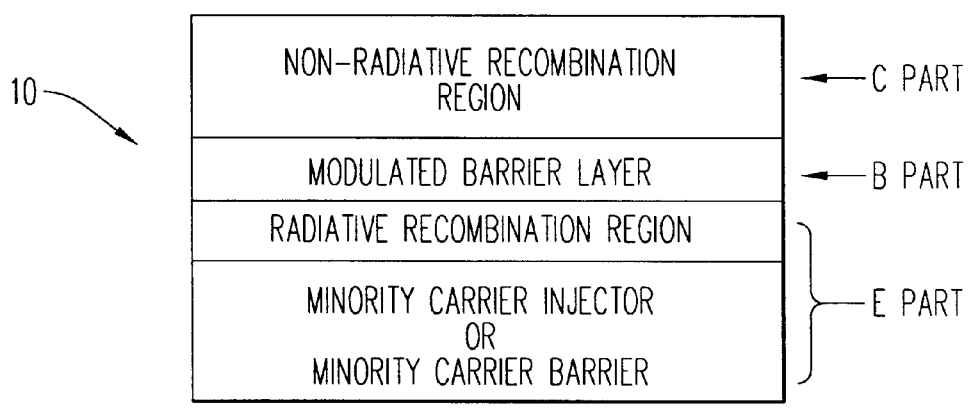
FIG. 7 is an enlarged cross-sectional view, not to scale, of a light emitting device in accordance with the teachings of this invention.

Referring first to FIG. 7, a light emitting device 10 includes a high efficiency light emitting region (referred to hereinafter as part E), such as a LED, laser diode, VCSELD, or an optically pumped light emitter; a minority carrier barrier (referred to hereinafter as part B), such as a resonant tunneling structure or other potential barrier (such as a triangular, square or parabolic potential barrier structure formed by compositional or impurity concentration grading); and a region that exhibits a low radiative recombination efficiency (relative to part E, e.g., by at least a factor of ten) and, preferably, a short minority carrier lifetime, preferably on the order of less than about 1–10 picoseconds (referred to hereinafter as part C). The part E can include intentionally doped semiconductor material and/or intentionally undoped semiconductor material. Part C can be constructed using a low temperature (LT) grown material such as, but not limited to, Be-doped LT GaAs and/or a thin, undoped GaAs layer with a Schottky barrier contact (e.g., Au on GaAs atop GaAs, which may be LT GaAs). In part E the light emission may be produced as a result of electrical bias (FIGS. 1–5) or by optical pumping (FIG. 6). In part B the resonant tunneling barrier can be constructed from two wide bandgap barrier layers such as, but not limited to, GaAlAs or GaInAsP, separated by a narrower bandgap layer such as, but not limited to, GaAs or GaInAsP. In one embodiment GaInAsP with a higher concentration of Ga and/or P comprises the barrier layer, while GaInAsP with a higher content of In and/or As constitutes the narrower bandgap layer.

In one embodiment of the light emitting device 10 the part E is a LED, part B is a triangular barrier or a resonant tunneling structure or diode, and part C is a region of LT GaAs. One technique to operate the device 10 is with the E-B parts biased at a constant current using a DC power supply, while the B-C parts are biased with another power supply and a modulating electrical signal (shown generally as a sinusoidal source in FIGS. 1B, 1C, 2B and 2C.

FIG. 1A shows the bandgap structure of the light emitting device 10 containing the LED (part E) and the resonant tunneling barrier (part B) with no bias on the E-B or B-C parts. FIG. 2A shows the light emitting device 10 embodiment that contains a LED (part E) and a triangular barrier (part B), with no bias for the E-B or B-C parts.

FIGS. 1B and 2B show the devices of FIGS. 1A and 2A, respectively, with forward biased E-B parts and unbiased B-C parts. Under these conditions the devices emit light with maximum efficiency as minority carriers are confined to the B parts by the resonant tunneling barrier and the triangular barrier, respectively. Under this condition, the light output intensity is maximized.

FIGS. 1C and 2C show the devices with forward biased E-B parts and biased B-C parts. In FIG. 1C the B-C part is biased such that the first energy state in the quantum well (QW) is aligned with the conduction band edge of B. Under this condition, minority carriers tunnel from E to B to C and quickly recombine non-radiatively. In FIG. 2C the B-C part is biased such that the conduction band electron barrier at the B-C interface is reduced, allowing increased emission over and/or tunneling through the barrier. Under these conditions, minority carriers cross from E to B to C and quickly recombine non-radiatively. The light output of the device 10 has been found to decrease in proportion to the number of carriers that cross from E to B to C.

In another embodiment of the light emitting device 10, part E includes a LED and part B is a compositional barrier and an undoped thin layer covered with a metal Schottky barrier. FIG. 3A shows this embodiment of the light emitting device 10 containing the LED and the compositionally graded B region. Part C in this embodiment is formed by a thin LT GaAs layer. The part B region is designed such that there is little to no barrier to electrons in the conduction band at the E-B interface, and the band bending in part B functions as a barrier to hole current in the valence band. One technique to operate this embodiment of the device 10 is with the E-B part biased with the DC power supply, while the B-C part is optically modulated. When no light is incident on the surface of the B region, electrons injected into or generated within the E region diffuse through the part B to the part C region and recombine non-radiatively. As a result, no light is emitted by the device, which may be considered as the "off" state of the device 10.

When light with energy greater than the bandgap energy of the B region is incident and absorbed in the near surface of the B region, electron-hole pairs are generated. Electrons drift into the metal region of the Schottky barrier, thermalize to the Fermi level (i.e., rapidly lose kinetic energy) and impose a negative charge on the metal. At the same time the holes drift toward the E region. The resulting charge separation induces a change in the an electric field in the B region, thereby causing less band bending than in the non-illuminated case. The decrease in band bending increases the barrier to electrons in the conduction band. Under these conditions the device 10 emits light with maximum efficiency as minority carriers are confined to the E part. Since the band bending in region B decreases, and, hence, the conduction band barrier at the E-B interface increases logarithmically with light intensity at the surface of the region B, this embodiment of the light emitting device 10 exhibits optical gain and, hence, may be considered as an all optical semiconductor light emitting device with optical gain.

In another embodiment of the light emitting device 10, which is similar in operation in some respects to the embodiment described in FIGS. 3A–3C, the E part is a LED, the B part is a compositionally graded barrier to holes, and the C part is a Schottky barrier. This embodiment in shown in FIG. 4A in an unbiased condition with no incident light. The B part is constructed so that the conduction band is essentially flat, and so that there is a barrier to hole diffusion into the C part under the no illumination condition. One technique to operate this embodiment of the light emitting device 10 is with the E-B part biased with the DC power supply, while the B-C part is optically modulated. When no light is incident on the surface of the B region (FIG. 4B), electrons injected into or generated within the E region diffuse to the C region and thermalize to the Fermi level non-radiatively. As such, no light is emitted by the device 10 (considered to be the 'off' state of the device 10).

Referring now to FIG. 4C, when light with energy greater than the bandgap of the B region is incident and absorbed in the near surface of the B region, electron-hole pairs are generated. Electrons drift into the metal region of the Schottky barrier, thermalize to the Fermi level and impose a negative charge on the metal. At the same time the holes drift toward the E part. The resulting charge separation induces a change in the electric field in the B part, thereby causing less band bending than in the non-illuminated case. The decrease in band bending increases the barrier to electron diffusion in the conduction band. Under these conditions the device emits light with maximum efficiency as minority carriers are confined to the E part. Since band bending in the B part decreases, and, hence, the conduction band barrier at the E-B interface increases logarithmically with light intensity at the surface of the B part. This embodiment of the invention thus also exhibits optical gain.

Referring to FIG. 5A, in another embodiment of the light emitting device 10 the E part includes a LED, the B part is a resonant tunneling (RT) barrier in series with a thin LT GaAs layer, and the C part is a metal Schottky barrier. The B part is constructed so that the first confined energy level within the quantum well (QW) is below the conduction band of the E part and so that the second confined energy level is above the conduction band of the E part.

One technique to operate this embodiment of the device 10 is with the E-B part biased with the DC power supply, while the B-C part is optically modulated. When no light is incident on the surface of the B part, electrons injected into or generated within the E part are confined to the E part. Under these conditions the device emits 10 light with maximum efficiency as minority carriers are confined to the E part.

In the same manner as the embodiments of FIG. 3 and 4, when light with energy greater than the bandgap energy of the B part is incident and absorbed in the near surface of the B part, electron-hole pairs are generated. Electrons drift into the metal region of the Schottky barrier, thermalize to the Fermi level and impose a negative charge on the metal, while the holes drift toward the E part. The resulting charge separation induces a change in the electric field in the B region, thereby causing less band bending than in the non-illuminated case. In the embodiment of FIG. 5C the decrease in band bending causes the first confined energy level within the quantum well (QW) to become aligned with the conduction band of the B part, and electrons tunnel through the resonant tunneling barrier and quickly recombine non-radiatively. This is the 'off' state of the device. It should be noted that this embodiment of the device 10 differs from the other embodiments described thus far in that it is inverting. That is, when light is incident on the device 10 the device 10 is in the 'off' state, and when light is not incident on the device 10, it is in the 'on' state.

It should be noted that in these embodiments there is an excess of minority carriers present due to the operation of the LED (or another one of the possible light sources (e.g., a VCSELD)).

In the previous embodiments of the light emitting device 10 the E part is fabricated as a LED that supplies minority carriers for radiative recombination. In a further embodiment of the device 10, and referring to FIG. 6A, the E part is fabricated as a region with high radiative efficiency (i.e., not as a pn junction as in a LED). The E part has a minority carrier diffusion barrier on one side opposite the B part, and the B and C parts may be as in FIGS. 3, 4, or 5. FIG. 6A shows this embodiment of the device 10 with, for example, a compositionally graded B part and a Schottky barrier C part.

Referring to FIG. 6B, when light with energy greater than the bandgap energy of the E part is absorbed in the E part, electron-hole pairs are generated. Subsequent radiative recombination results in light emission from the E part. The E part is thus optically 'pumped', resulting in a photoluminescent output. This form of the device 10 is thus all-optical, as there need be no external electrical connections.

Referring to FIG. 6C, when light with energy greater than the bandgap energy of the B part is incident and absorbed in the near surface of the B part, electron-hole pairs are generated. Electrons drift into the metal region of the Schottky barrier, thermalize to the Fermi level, and impose a negative charge on the metal while the holes drift toward the E part. The resulting charge separation induces a changes in the electric field in the B part, thereby causing less band bending than in the non-illuminated case. The decrease in band bending increases the barrier to electron diffusion from the B part into the C part. Under these conditions the device emits light with maximum efficiency as minority carriers are confined to the E part. Since band bending in the B part decreases and, hence, the conduction band barrier at the E-B interface increases logarithmically with light intensity at the surface of the B part, this embodiment of the device 10 also exhibits optical gain.

In general, the various device 10 layer compositions and thicknesses can be adjusted to provide the desired optical/electronic properties, as will be evident to those skilled in the art when guided by the foregoing teachings. By example only, the B part, when constructed as a triangular barrier, has a thickness in the range of about 50 nm to about 100 nm, and is made of GaAlAs having a composition that varies through the thickness of the layer, as is known in the art. When the B part is fabricated as a resonant tunneling structure, the two wide bandgap layers may each have a thickness in the range of about 1.5 nm to about 5 nm, while the intervening layer of narrower bandgap material may a thickness in the range of about 2 nm to about 5 nm. A typical thickness for the region with low radiative recombination efficiency (part C) can be in the range of about 30 nm to about 100 nm. By "low temperature grown" is implied a fabrication temperature in the range of about 225 C. to about 350 C., while the typical (normal) fabrication temperatures for the GaAs and GaAlAs materials described herein are in the range of about 550 C.

to about 700 C. It should be noted that the teachings of this invention are not limited to the use of LT material as described above, and that "normal temperature" grown materials can be used as well. One suitable type of deposition technique for fabricating the light emitting devices 10 is molecular beam epitaxy (MBE), although other suitable types of deposition or layer growth techniques can be employed as well, such as metal-organic chemical vapor deposition (MOCVD). For the embodiment of FIG. 6 the non-pn junction E part is preferably comprised of p-type GaAs, and the diffusion barrier placed on one side of the E part may be a layer of GaAlAs having a thickness in the range of about 5 nm to 100 nm. A suitable wavelength of the pumping light is 632 nm (e.g., a HeNe laser emission), while in the embodiments of FIGS. 3, 4, 5 and 6 a suitable wavelength for the modulation light is in the range of about 400 nm to about 500 nm. For other Group III-V materials, such as InGaAsP emitting at 1.3 microns to 1.5 microns the wavelength of the pump light should be short enough to be fully absorbed in the region E but not absorbed by regions B or C. The modulation light wavelength should be short enough to by fully absorbed by region B.

In accordance with the high speed light emitting device made possible by the teachings of this invention, the modulation light can be frequency modulated above 1 GHz, such as at 10 GHz, and it is believed that significantly higher modulation frequencies may be attainable (e.g., possibly up to the near Terahertz (THz) range).

Furthermore, while described in the context of various embodiments of light emitting devices 10 constructed using Group III-V materials, at least some of these disclosed embodiments may be fabricated using other materials, including Group IV alloy materials such as Si—Ge, Group II-VI materials, and the III-N materials (i.e., Group III-V nitrides). Combinations of these materials may also be employed in some embodiments.

Also, while the disclosure has been made in the context of p-type material wherein the minority carriers are electrons, it is clearly within the scope of these teachings to construct devices using n-type material, wherein the minority carriers are holes.

As such, while this invention has been disclosed and described with respect to preferred embodiments thereof, it will be understood by those skilled in the art that changes in form and details may be made therein without departing from the scope and spirit of the invention.

What is claimed is:

1. A light emitting device, comprising:
   a first part comprising a source of excess minority carriers;
   a second part coupled to said first part, said second part comprising a minority carrier barrier; and
   a third part coupled to said second part, said third part comprising a region that exhibits a low radiative recombination efficiency and a short minority carrier lifetime; wherein
   in response to a first stimulus minority carriers are constrained by said second part to remain in said first part, leading to an increase of minority carrier radiative recombination in said first part and an increase in light emission; and wherein
   in response to a second stimulus said minority carriers are enabled to cross said minority carrier barrier of said second part to enter said third part, leading to a decrease of minority carrier radiative recombination in said first part and a decrease in light emission.

2. A light emitting device as in claim 1, wherein said first stimulus comprises an absence of an electrical signal applied between said second part and said third part, and wherein said second stimulus comprises a presence of the electrical signal applied between said second part and said third part.

3. A light emitting device as in claim 1, wherein said first stimulus induces a change in an electric field in said second part that is generated by optically induced electron-hole pairs in said second part, and wherein said second stimulus comprises a presence of the electric field present prior to said first stimulus.

4. A light emitting device as in claim 1, wherein said first stimulus comprises a presence of an electric field in said second part, and wherein said second stimulus comprises a change in the electric field generated by optically induced electron-hole pairs in said second part.

5. A light emitting device as in claim 1, wherein said first part is comprised of a light emitting diode.

6. A light emitting device as in claim 1, wherein said first part is comprised of a resonant cavity light emitting diode.

7. A light emitting device as in claim 1, wherein said first part is comprised of a laser diode.

8. A light emitting device as in claim 1, wherein said first part is comprised of a vertical cavity surface emitting laser device.

9. A light emitting device as in claim 1, wherein said second part is comprised of a resonant tunneling structure.

10. A light emitting device as in claim 1, wherein said second part is comprised of a quantum well structure.

11. A light emitting device as in claim 1, wherein said second part is comprised of one of a triangular, square or parabolic potential barrier structure formed by compositional grading or impurity concentration grading.

12. A light emitting device as in claim 1, wherein said third part is comprised of a low temperature grown material.

13. A light emitting device as in claim 12, wherein said low temperature grown material is comprised of doped low temperature grown GaAs.

14. A light emitting device as in claim 1, wherein said third part is comprised of an undoped layer with a Schottky barrier contact.

15. A light emitting device as in claim 1, wherein in said first part the light emission is produced as a result of optical pumping that results in a photoluminescent emission or a laser-like or laser-type emission.

16. A light emitting device as in claim 1, wherein said first stimulus comprises a presence of a modulating light incident on said second part and a decrease in band bending.

17. A light emitting device as in claim 1, wherein said second stimulus comprises a presence of a modulating light incident on said second part and a decrease in band bending.

18. A light emitting device that exhibits optical gain, comprising:
a first part comprising a source of excess minority carriers;
a second part coupled to said first part, said second part comprising a minority carrier barrier; and
a third part coupled to said second part, said third part comprising a region that exhibits a low radiative recombination efficiency and a short minority carrier lifetime; wherein
in response to a presence of a change in an electric field in said second part that is generated by optically induced electron-hole pairs in said second part, minority carriers are constrained to remain in said first part, resulting in an increase of minority carrier radiative recombination in said first part and an increase in light emission; and wherein
in response to an absence of a change in the electric field in said second part said minority carriers are enabled to cross said minority carrier barrier of said second part to enter said third part, resulting in a decrease of minority carrier radiative recombination in said first part and a decrease in light emission.

19. A light emitting device that exhibits optical gain, comprising:
a first part comprising a source of excess minority carriers;
a second part coupled to said first part, said second part comprising a minority carrier barrier; and
a third part coupled to said second part, said third part comprising a region that exhibits a low radiative recombination efficiency and a short minority carrier lifetime; wherein
in response to a change in an electric field in said second part that is generated by optically induced electron-hole pairs in said second part, minority carriers are enabled to cross said minority carrier barrier of said second part to enter said third part, resulting in a decrease of minority carrier radiative recombination in said first part and a decrease in light emission, and wherein
in response to an absence of a change in the electric field in said second part said minority carriers are constrained to remain in said first part, resulting in an increase of minority carrier radiative recombination in said first part and an increase in light emission.

20. A light emitting device, comprising:
a first part comprising a source of excess electron-hole pairs;
a second part coupled to said first part, said second part comprising a minority carrier barrier; and
a third part coupled to said second part, said third part comprising a region that exhibits a low radiative recombination efficiency and a short minority carrier lifetime; wherein
in response to a first stimulus minority carriers are constrained by said second part to remain in said first part, leading to an increase of minority carrier radiative recombination in said first part and an increase in light emission; and wherein
in response to a second stimulus said minority carriers are enabled to cross said minority carrier barrier of said second part to enter said third part, leading to a decrease of minority carrier radiative recombination in said first part and a decrease in light emission.

\* \* \* \* \*